United States Patent
Cho et al.

(10) Patent No.: US 8,896,133 B2
(45) Date of Patent: *Nov. 25, 2014

(54) SEMICONDUCTOR DEVICE AND METHOD OF FORMING VERTICALLY OFFSET CONDUCTIVE PILLARS OVER FIRST SUBSTRATE ALIGNED TO VERTICALLY OFFSET BOT INTERCONNECT SITES FORMED OVER SECOND SUBSTRATE

(71) Applicant: STATS ChipPAC, Ltd., Singapore (SG)

(72) Inventors: SungWon Cho, Kyoung-gi-Do (KR);
KiYoun Jang, Kyoungiki-do (KR);
YongHee Kang, Kyoungki-do (KR);
Hyung Sang Park, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/870,928

(22) Filed: Apr. 25, 2013

(65) Prior Publication Data

US 2013/0234324 A1     Sep. 12, 2013

Related U.S. Application Data

(62) Division of application No. 12/858,163, filed on Aug. 17, 2010, now Pat. No. 8,492,197.

(51) Int. Cl.
| | | |
|---|---|---|
| *H01L 23/48* | (2006.01) | |
| *H01L 21/48* | (2006.01) | |
| *H01L 23/00* | (2006.01) | |
| *H01L 23/498* | (2006.01) | |
| *H01L 21/56* | (2006.01) | |

(52) U.S. Cl.
CPC ....... *H01L 24/09* (2013.01); *H01L 2924/01029* (2013.01); *H01L 2224/13113* (2013.01); *H01L 2224/11464* (2013.01); *H01L 21/4857* (2013.01); *H01L 2224/11903* (2013.01); *H01L 24/16* (2013.01); *H01L 2224/81193* (2013.01);

(Continued)

(58) Field of Classification Search
CPC ..... H01L 24/09; H01L 24/10; H01L 23/3128; H01L 23/485
USPC .......................................... 257/686, 737, 778
See application file for complete search history.

(56) References Cited

U.S. PATENT DOCUMENTS

| 5,378,859 A | 1/1995 | Shirasaki et al. |
| 5,386,624 A | 2/1995 | George et al. |

(Continued)

FOREIGN PATENT DOCUMENTS

| JP | H04-355933 | 12/1992 |
| JP | 10-256307 | 9/1998 |

(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Nathan Ha

(74) *Attorney, Agent, or Firm* — Robert D. Atkins; Atkins and Associates, P.C.

(57) ABSTRACT

A semiconductor device has a first substrate and first conductive pillars formed over the first substrate. Second conductive pillars are formed over the first substrate alternating with the first conductive pillars. The second conductive pillars are vertically offset with respect to the first conductive pillars. First BOT interconnect sites are formed over a second substrate. Second BOT interconnect sites are formed over the second substrate alternating with the first interconnect sites. The second interconnect sites are vertically offset with respect to the first interconnect sites. The first substrate is mounted to the second substrate such that the first conductive pillars are aligned with and electrically connected to the first interconnect sites and the second conductive pillars are aligned with and electrically connected to the second interconnect sites. An underfill material is deposited between the first and second substrates. The first substrate can be a flipchip type semiconductor device.

25 Claims, 19 Drawing Sheets

(52) U.S. Cl.

..... H01L 2224/13083 (2013.01); H01L 2224/29144 (2013.01); H01L 2224/11849 (2013.01); H01L 2224/81385 (2013.01); H01L 2224/81444 (2013.01); H01L 2224/1145 (2013.01); H01L 2924/01322 (2013.01); H01L 2224/11452 (2013.01); H01L 2224/73204 (2013.01); H01L 2224/11462 (2013.01); H01L 2224/16238 (2013.01); H01L 2924/10329 (2013.01); H01L 2224/05655 (2013.01); H01L 2224/05647 (2013.01); H01L 24/48 (2013.01); H01L 2224/32225 (2013.01); H01L 2224/2919 (2013.01); H01L 2924/10252 (2013.01); H01L 24/17 (2013.01); H01L 2224/13155 (2013.01); H01L 23/49827 (2013.01); H01L 2924/014 (2013.01); H01L 2224/13111 (2013.01); H01L 2924/01033 (2013.01); H01L 2924/01049 (2013.01); H01L 24/11 (2013.01); H01L 2924/01023 (2013.01); H01L 2224/81447 (2013.01); H01L 2224/05611 (2013.01); H01L 2224/13144 (2013.01); H01L 2224/13139 (2013.01); H01L 2224/13099 (2013.01); H01L 2224/11831 (2013.01); H01L 2224/81455 (2013.01); H01L 24/13 (2013.01); H01L 2224/48158 (2013.01); H01L 2224/1147 (2013.01); H01L 2224/8385 (2013.01); H01L 2924/15311 (2013.01); H01L 2224/05624 (2013.01); H01L 24/32 (2013.01); H01L 2924/13091 (2013.01); H01L 2224/1132 (2013.01); H01L 2924/10272 (2013.01); H01L 2224/73265 (2013.01); H01L 2224/16225 (2013.01); H01L 2224/81424 (2013.01); H01L 2224/11901 (2013.01); H01L 2224/13147 (2013.01); H01L 2224/81801 (2013.01); H01L 2224/1155 (2013.01); H01L 2224/13124 (2013.01); H01L 24/14 (2013.01); H01L 2224/81011 (2013.01); H01L 2224/1403 (2013.01); H01L 2924/01079 (2013.01); H01L 2924/10253 (2013.01); H01L 2224/83102 (2013.01); H01L 2224/92125 (2013.01); H01L 2224/81022 (2013.01); H01L 2224/11334 (2013.01); H01L 2224/81411 (2013.01); H01L 23/49822 (2013.01); H01L 2224/13082 (2013.01); H01L 2924/10335 (2013.01); H01L 2224/48105 (2013.01); H01L 2924/01082 (2013.01); H01L 2224/05639 (2013.01); H01L 2224/81439 (2013.01); H01L 21/563 (2013.01); H01L 2224/48091 (2013.01); H01L 2924/01013 (2013.01); H01L 2224/16237 (2013.01); H01L 2224/05644 (2013.01); H01L 2224/13116 (2013.01); H01L 2924/01047 (2013.01); H01L 2924/3841 (2013.01); H01L 2224/04042 (2013.01); H01L 24/81 (2013.01)

USPC .................................................. 257/778

(56) References Cited

U.S. PATENT DOCUMENTS

| | | | |
|---|---|---|---|
| 5,434,410 A | 7/1995 | Kulwicki | |
| 5,508,561 A | 4/1996 | Tago et al. | |
| 5,519,580 A | 5/1996 | Natarajan et al. | |
| 5,573,171 A | 11/1996 | Kong et al. | |
| 5,650,595 A | 7/1997 | Bentlage et al. | |
| 5,710,071 A | 1/1998 | Beddingfield et al. | |
| 5,828,128 A | 10/1998 | Higashiguchi et al. | |
| 5,844,782 A | 12/1998 | Fukasawa | |
| 5,869,886 A | 2/1999 | Tokuno | |
| 5,872,399 A | 2/1999 | Lee | |
| 5,889,326 A | 3/1999 | Tanaka | |
| 5,915,169 A | 6/1999 | Heo | |
| 5,985,456 A | 11/1999 | Zhou et al. | |
| 6,001,493 A * | 12/1999 | Rutledge et al. | 428/620 |
| 6,190,940 B1 | 2/2001 | DeFelice et al. | |
| 6,201,305 B1 | 3/2001 | Darveaux et al. | |
| 6,218,630 B1 | 4/2001 | Takigami | |
| 6,228,466 B1 | 5/2001 | Tsukada et al. | |
| 6,259,163 B1 | 7/2001 | Ohuchi et al. | |
| 6,281,450 B1 | 8/2001 | Urasaki et al. | |
| 6,297,560 B1 | 10/2001 | Capote et al. | |
| 6,324,754 B1 | 12/2001 | DiStefano et al. | |
| 6,329,605 B1 | 12/2001 | Beroz et al. | |
| 6,335,568 B1 | 1/2002 | Yuzawa et al. | |
| 6,335,571 B1 | 1/2002 | Capote et al. | |
| 6,396,707 B1 | 5/2002 | Huang et al. | |
| 6,448,665 B1 | 9/2002 | Nakazawa et al. | |
| 6,550,665 B1 | 4/2003 | Parrish et al. | |
| 6,573,610 B1 | 6/2003 | Tsai | |
| 6,600,234 B2 | 7/2003 | Kuwabara et al. | |
| 6,608,388 B2 | 8/2003 | Lin et al. | |
| 6,622,905 B2 * | 9/2003 | Shier et al. | 228/180.22 |
| 6,710,458 B2 | 3/2004 | Seko | |
| 6,734,557 B2 | 5/2004 | Taniguchi et al. | |
| 6,774,497 B1 | 8/2004 | Qi et al. | |
| 6,780,673 B2 | 8/2004 | Venkateswaran | |
| 6,787,918 B1 | 9/2004 | Tsai et al. | |
| 6,809,262 B1 | 10/2004 | Hsu | |
| 6,818,545 B2 * | 11/2004 | Lee et al. | 438/614 |
| 6,849,944 B2 | 2/2005 | Murtuza et al. | |
| 6,870,276 B1 | 3/2005 | Moxham et al. | |
| 6,888,255 B2 | 5/2005 | Murtuza et al. | |
| 6,913,948 B2 | 7/2005 | Caletka et al. | |
| 7,005,585 B2 | 2/2006 | Ishizaki | |
| 7,005,750 B2 | 2/2006 | Liu | |
| 7,019,407 B2 | 3/2006 | Chen et al. | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,098,407 B2 | 8/2006 | Kim et al. | |
| 7,102,239 B2 | 9/2006 | Pu et al. | |
| 7,173,828 B2 | 2/2007 | Lin et al. | |
| 7,191,515 B2 | 3/2007 | Sundahl et al. | |
| 7,208,834 B2 * | 4/2007 | Lee et al. | 257/737 |
| 7,224,073 B2 | 5/2007 | Kim | |
| 7,271,484 B2 | 9/2007 | Reiss et al. | |
| 7,294,929 B2 | 11/2007 | Miyazaki | |
| 7,312,529 B2 | 12/2007 | Clevenger et al. | |
| 7,317,245 B1 | 1/2008 | Lee et al. | |
| 7,405,484 B2 | 7/2008 | Usui et al. | |
| 7,436,063 B2 | 10/2008 | Miyata et al. | |
| 7,449,716 B2 * | 11/2008 | Chen et al. | 257/48 |
| 7,521,284 B2 | 4/2009 | Miranda et al. | |
| 7,642,660 B2 | 1/2010 | Tay et al. | |
| 7,670,939 B2 | 3/2010 | Topacio et al. | |
| 7,671,454 B2 | 3/2010 | Seko | |
| 7,732,913 B2 | 6/2010 | Hsieh et al. | |
| 7,750,457 B2 | 7/2010 | Seko | |
| 7,781,867 B2 * | 8/2010 | Lee | 257/618 |
| 7,790,509 B2 | 9/2010 | Gerber | |
| 7,791,211 B2 | 9/2010 | Chen et al. | |
| 7,847,399 B2 | 12/2010 | Masumoto | |
| 7,847,417 B2 | 12/2010 | Araki et al. | |
| 7,851,928 B2 | 12/2010 | Gallegoes et al. | |
| 7,898,083 B2 | 3/2011 | Castro | |
| 7,902,660 B1 | 3/2011 | Lee et al. | |
| 7,902,678 B2 | 3/2011 | Ohuchi et al. | |
| 7,902,679 B2 | 3/2011 | Lin et al. | |
| 7,932,170 B1 | 4/2011 | Huemoeller et al. | |
| 7,947,602 B2 | 5/2011 | Ito et al. | |
| 8,115,310 B2 | 2/2012 | Masumoto et al. | |
| 8,299,368 B2 * | 10/2012 | Endo | 174/261 |
| 2004/0056341 A1 | 3/2004 | Endo et al. | |
| 2004/0232562 A1 | 11/2004 | Hortaleza et al. | |
| 2005/0103516 A1 | 5/2005 | Kaneyuki | |
| 2005/0133933 A1 | 6/2005 | Shen et al. | |
| 2005/0248037 A1 | 11/2005 | Hung et al. | |

| | | |
|---|---|---|
| 2006/0131758 A1 | 6/2006 | Dao |
| 2006/0216860 A1 | 9/2006 | Pendse |
| 2007/0152313 A1* | 7/2007 | Periaman et al. ............. 257/686 |
| 2007/0200234 A1 | 8/2007 | Gerber et al. |
| 2008/0093749 A1 | 4/2008 | Gerber et al. |
| 2008/0122117 A1 | 5/2008 | Pendse |
| 2008/0179740 A1 | 7/2008 | Liao |
| 2008/0277802 A1 | 11/2008 | Tsai et al. |
| 2009/0108445 A1 | 4/2009 | Liang |
| 2009/0114436 A1 | 5/2009 | Chen et al. |
| 2009/0146298 A1 | 6/2009 | Masumoto |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao |
| 2010/0059866 A1 | 3/2010 | Jang et al. |
| 2010/0139965 A1 | 6/2010 | Wang et al. |
| 2011/0049703 A1 | 3/2011 | Hsu et al. |
| 2011/0221058 A1* | 9/2011 | Pagaila et al. ................ 257/737 |
| 2014/0008783 A1* | 1/2014 | Cho et al. ..................... 257/692 |

FOREIGN PATENT DOCUMENTS

| | | |
|---|---|---|
| JP | 2000-031204 | 1/2000 |
| JP | 2004-221205 | 8/2004 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

* cited by examiner

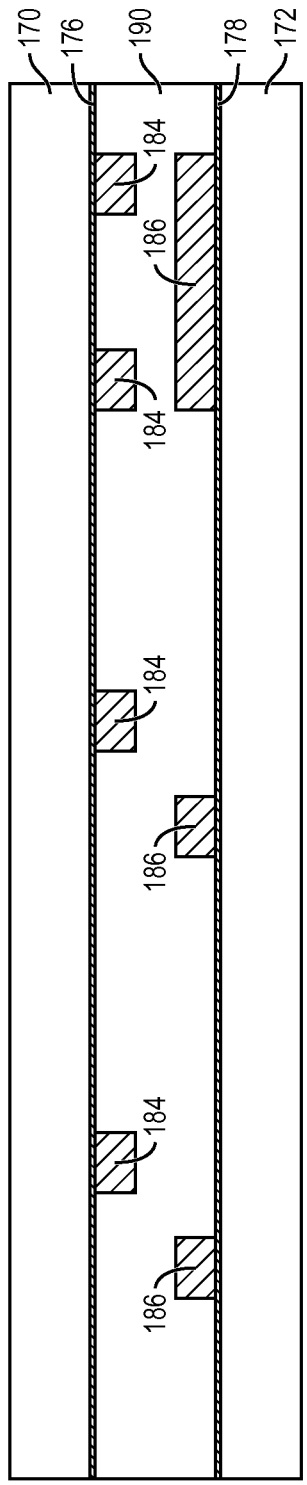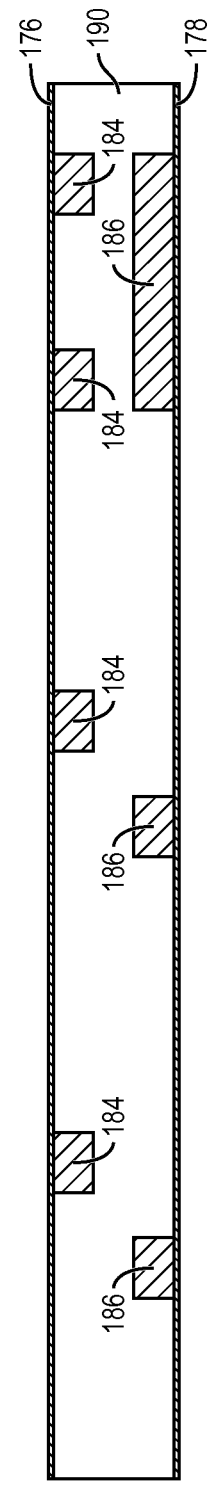

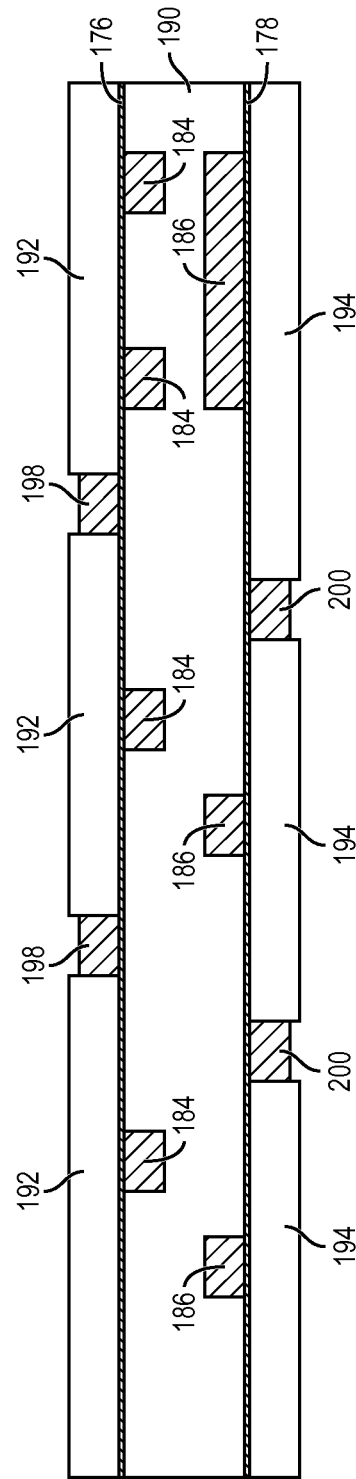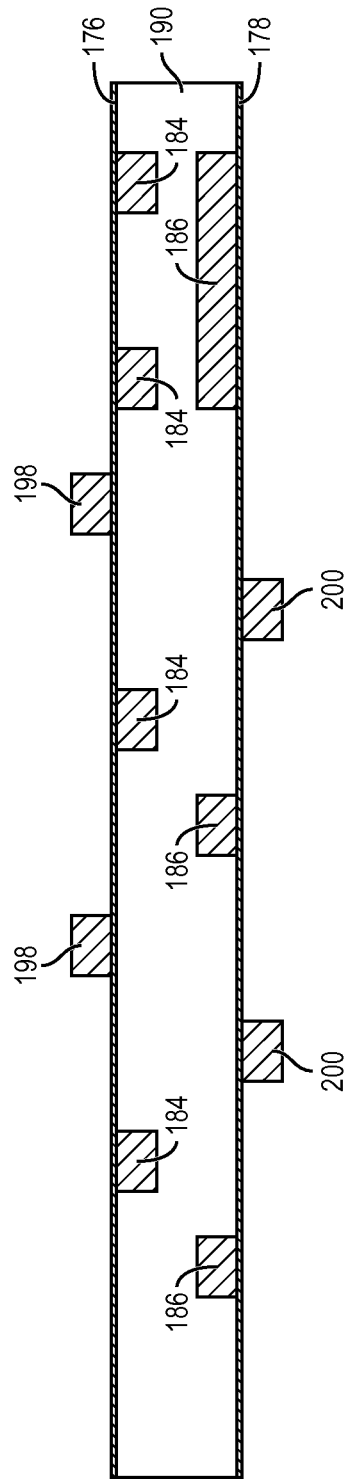

SEMICONDUCTOR DEVICE AND METHOD OF FORMING VERTICALLY OFFSET CONDUCTIVE PILLARS OVER FIRST SUBSTRATE ALIGNED TO VERTICALLY OFFSET BOT INTERCONNECT SITES FORMED OVER SECOND SUBSTRATE

CLAIM TO DOMESTIC PRIORITY

The present application is a division of U.S. patent application Ser. No. 12/858,163, now U.S. Pat. No. 8,492,197, filed Aug. 17, 2010,which application is incorporated herein by reference.

FIELD OF THE INVENTION

The present invention relates in general to semiconductor devices and, more particularly, to a semiconductor device and method of forming vertically offset conductive pillars over a first substrate aligned to vertically offset bond on trace (BOT) interconnect sites over a second substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional flipchip type semiconductor die 10 with conductive pillars 12 formed on active surface 14. Bumps 16 are formed on conductive pillars 12. Semiconductor die 10 is mounted to printed circuit board (PCB) or substrate 18 with bumps 16 electrically connected to interconnect sites 20. As semiconductor die increase in complexity, electrical routing density must increase to provide more interconnect capability for a given die area. High routing density typically involves fine interconnect pitch. However, the fine routing pitch can cause electrical shorts or bridging between adjacent bumps 16 during a bump reflow process, as shown by bridge 22.

SUMMARY OF THE INVENTION

A need exists to provide a fine pitch electrical interconnect while minimizing electrical shorts between adjacent bumps. Accordingly, in one embodiment, the present invention is a semiconductor device comprising a first substrate and first conductive pillar formed over the first substrate. A second conductive pillar is formed over the first substrate vertically offset with respect to the first conductive pillar. A first interconnect structure is formed over the first conductive pillar. A second interconnect structure is formed over the second conductive pillar with the second interconnect structure overlapping the first interconnect structure.

In another embodiment, the present invention is a semiconductor device comprising a first substrate and plurality of conductive pillars formed over the first substrate with alternating ones of the conductive pillars vertically offset with respect to intermediate ones of the conductive pillars. A plurality of bumps is formed over the conductive pillars with the bumps formed over adjacent ones of the conductive pillars overlapping.

In another embodiment, the present invention is a semiconductor device comprising a first substrate and plurality of conductive pillars formed over the first substrate. A bump material is formed over the conductive pillars with adjacent bump material separate and overlapping.

In another embodiment, the present invention is a semiconductor device comprising a first substrate and plurality of conductive pillars formed over the first substrate. A plurality of interconnect structures is formed over the conductive pillars with adjacent interconnect structures overlapping.

DETAILED DESCRIPTION OF THE DRAWINGS

Figure 1:
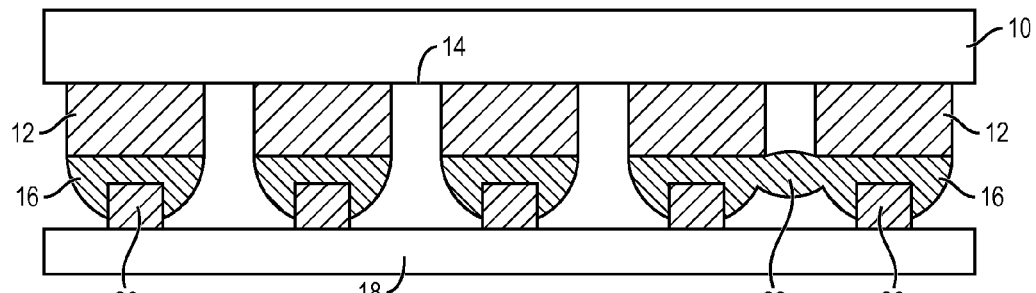
FIG. 1 illustrates a conventional flipchip type semiconductor die susceptible to electrical shorts between adjacent bumps.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
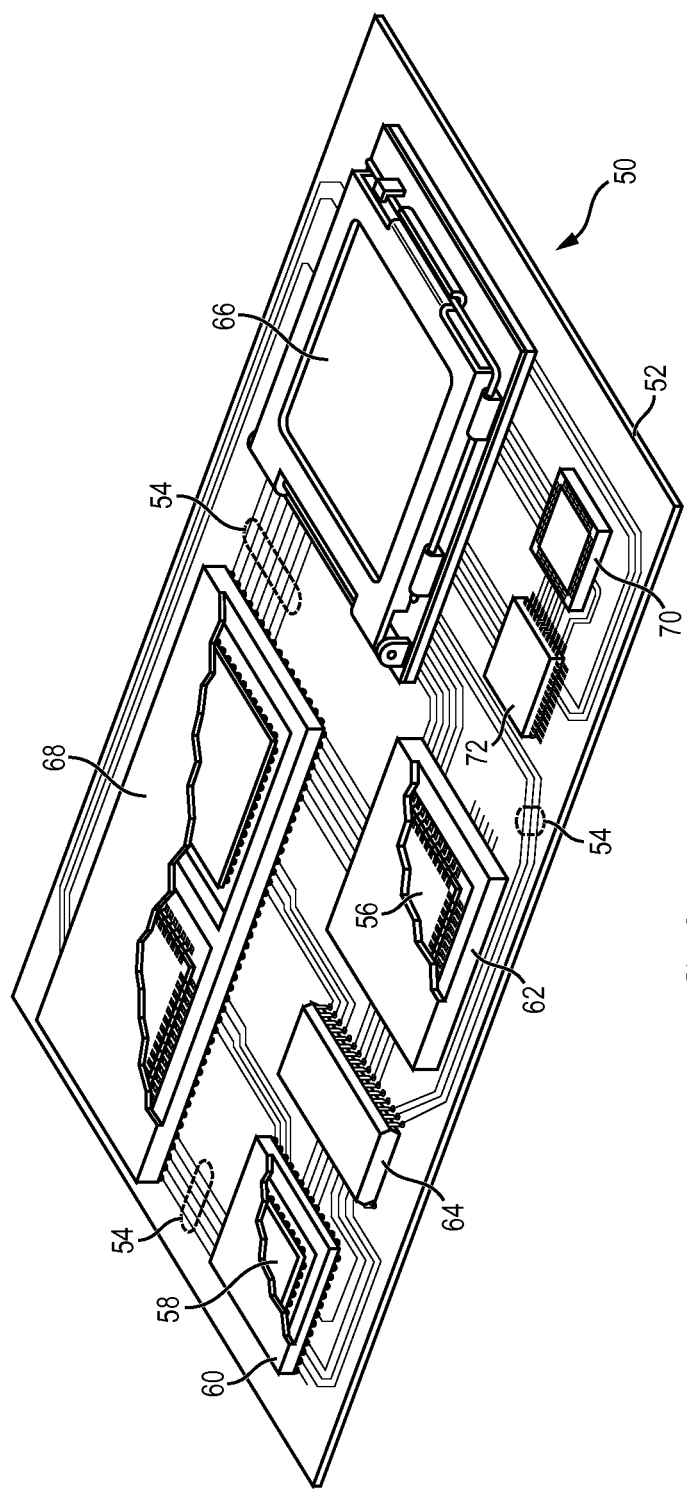
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
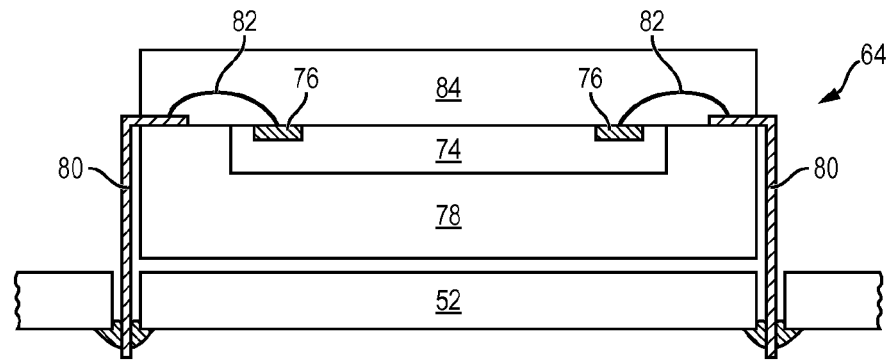
FIGS. 3a-3c illustrate further detail of the representative semiconductor packages mounted to the PCB.
Figure 3B:
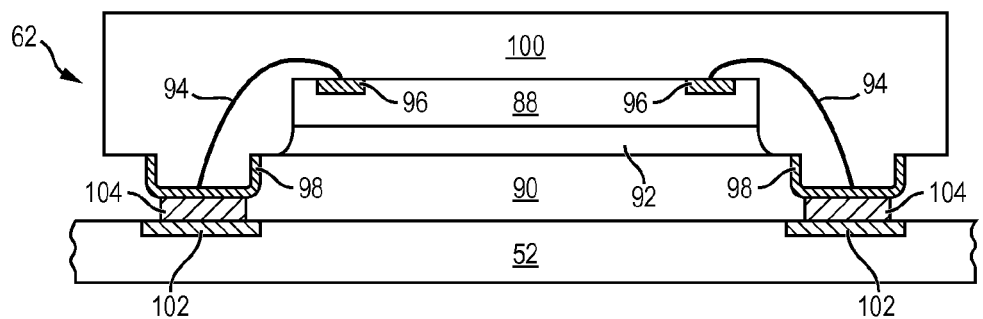
Figure 3C:
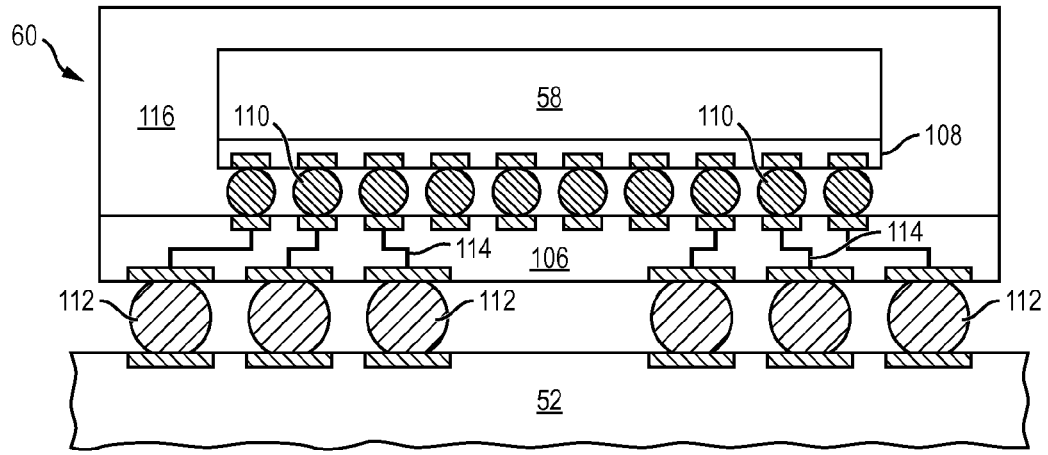

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 4A:
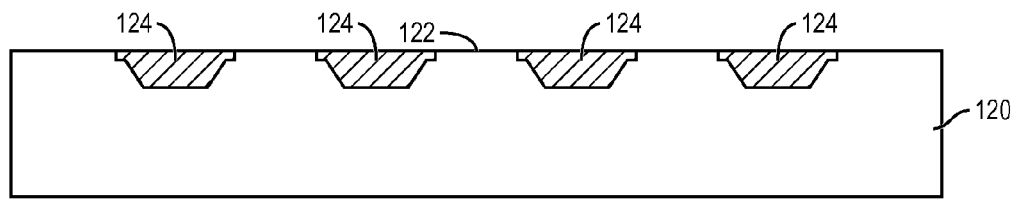
FIGS. 4a-4l illustrate a process of forming vertically offset conductive pillars over a substrate.

FIGS. 4a-4l illustrate, in relation to FIGS. 2 and 3a-3c, a process of forming vertically offset conductive pillars over a substrate. FIG. 4a shows a semiconductor substrate 120 containing a base semiconductor material, such as silicon, germanium, gallium arsenide, indium phosphide, or silicon carbide, for structural support. A plurality of analog or digital circuits can be formed on active surface 122 of substrate 120, implemented as active devices, passive devices, conductive layers, and dielectric layers and electrically interconnected according to the electrical design and function of the die. For example, the circuit may include one or more transistors, diodes, and other circuit elements formed within active surface 122 to implement analog circuits or digital circuits, such as digital signal processor (DSP), ASIC, memory, or other signal processing circuit. A plurality of integrated passive devices (IPD), such as inductors, capacitors, and resistors, can also be formed over substrate 120 for RF signal processing. A plurality of contact pads 124 is formed in active surface 122 and electrically connected to the circuits and IPDs on the active surface.

Figure 4B:
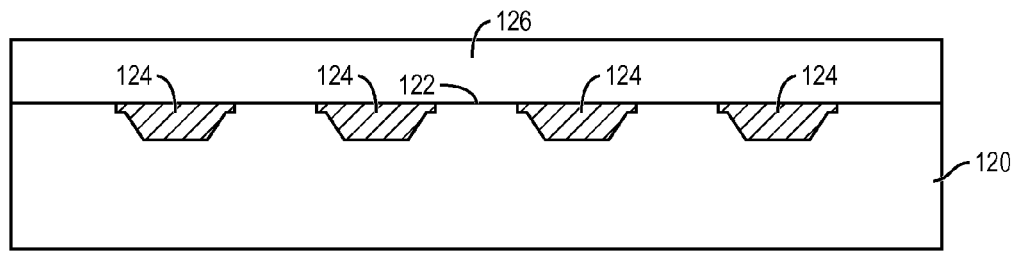
Figure 4C:
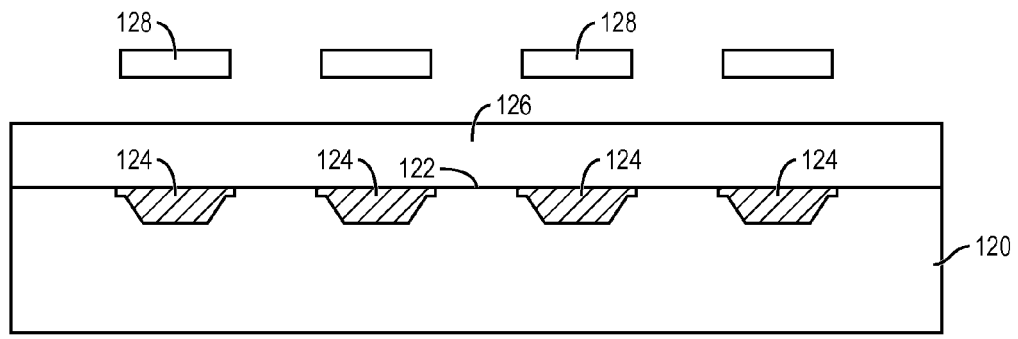
Figure 4D:
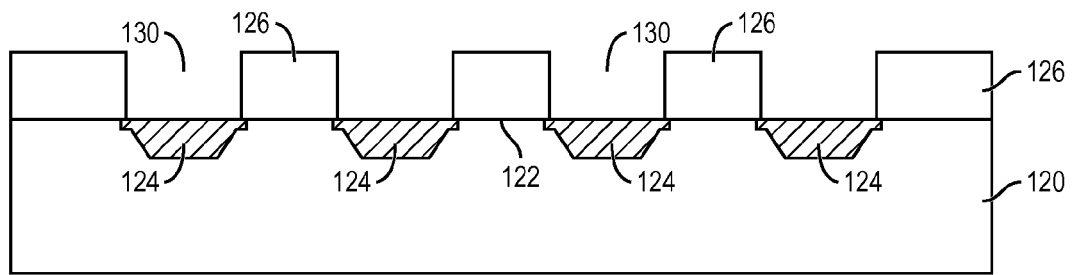

In FIG. 4b, a first photoresist layer 126 is deposited over active surface 122 and contact pads 124. A mask 128 is positioned over contact pads 124 and photoresist layer 126 is exposed to ultraviolet (UV) light, as shown in FIG. 4c. In FIG. 4d, mask 128 is removed. The portion of photoresist layer 126 that was under mask 128 is removed by an etching process to form openings 130 and expose contact pads 124. The remaining portion of photoresist layer 126 still covers active surface 122 between contact pads 124.

Figure 4E:
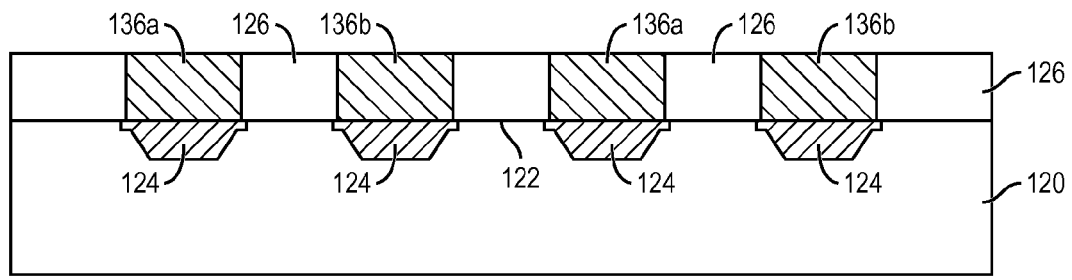

In FIG. 4e, an electrically conductive layer 136 is formed within openings 130 of photoresist 126 over contact pads 124 using a patterning and metal deposition process such as printing, PVD, CVD, sputtering, electrolytic plating, and electroless plating. Conductive layer 136 can be one or more layers of Al, Cu, Sn, Ni, Au, Ag, or other suitable electrically conductive material. Conductive layer 136 formed in openings 130 provides first level conductive pillars electrical connected to contact pads 124 and the circuits on active surface 122. The first level conductive pillars are identified as alternating conductive pillars 136a and alternating conductive pillars 136b.

Figure 4F:
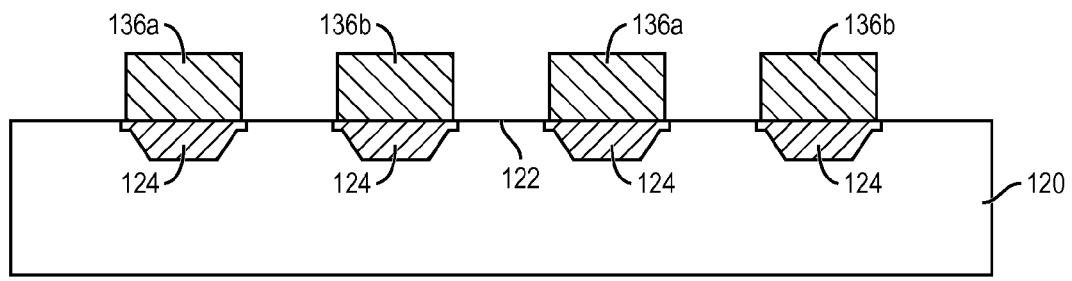
Figure 4G:
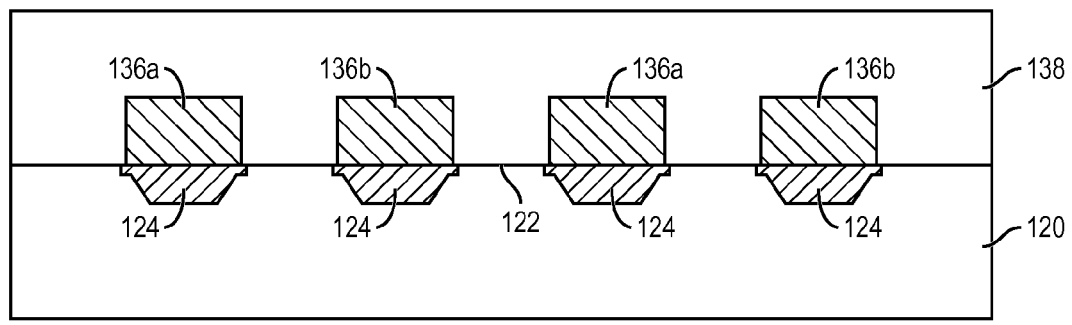
Figure 4H:
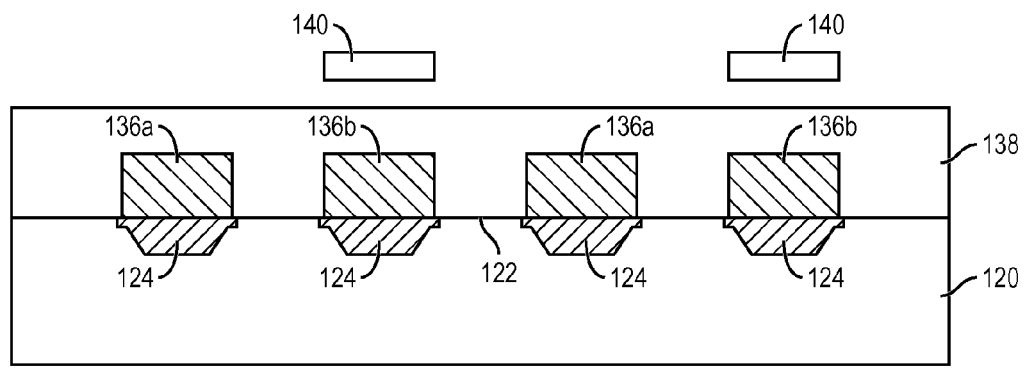
Figure 4I:
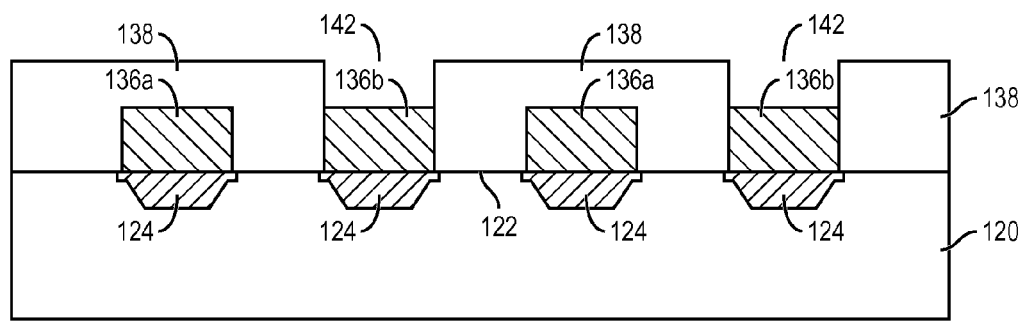

In FIG. 4f, the remaining portion of photoresist layer 126 is removed. A second photoresist layer 138 is deposited over active surface 122 and first level conductive pillars 136a and 136b, as shown in FIG. 4g. In FIG. 4h, a mask 140 is positioned over alternating conductive pillars 136b and photoresist layer 138 is exposed to UV light. In FIG. 4i, mask 140 is removed. The portion of photoresist layer 138 that was under mask 140 is removed by an etching process to form openings 142 and expose alternating conductive pillars 136b. The remaining portion of photoresist layer 138 still covers active surface 122 and alternating conductive pillars 136a not exposed by openings 142.

Figure 4J:
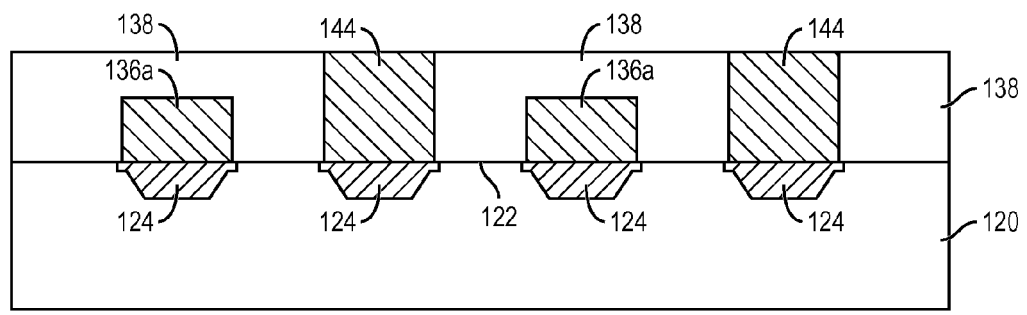

In FIG. 4j, an electrically conductive layer 144 is formed within openings 142 of photoresist 138 over conductive pillars 136b using PVD, CVD, electrolytic plating, electroless plating process, or other suitable metal deposition process. Conductive layer 144 can be one or more layers of Al, Cu, Sn, Ni, Au, Ag, or other suitable electrically conductive material. Conductive layer 144 formed in openings 142 provides second level conductive pillars (combination of conductive layer 144 and 136b) electrically connected to contact pads 124 and the circuits on active surface 122.

Figure 4K:
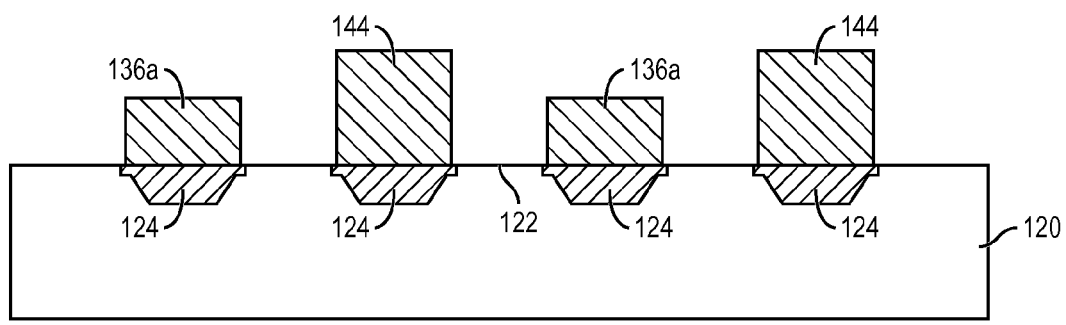

In FIG. 4k, the remaining portion of photoresist layer 138 is removed. The second level conductive pillars 144 are vertically offset with respect to first level conductive pillars 136a.

Figure 4L:
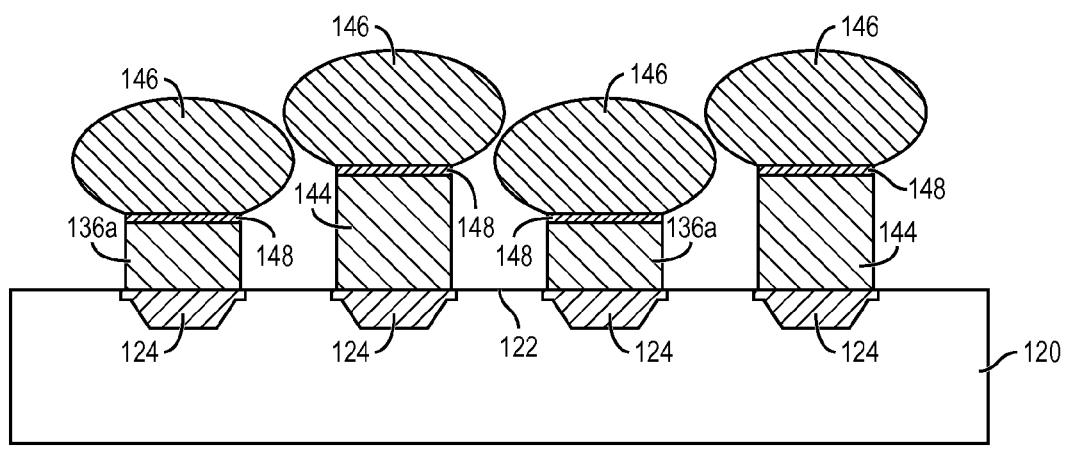

In FIG. 4l, an electrically conductive bump material is deposited over first level conductive pillars 136a and second level conductive pillars 144 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to vertically offset conductive pillars 136a and 144 using a suitable attachment or bonding process. In one embodiment, the bump material is reflowed by heating the material above its melting point to form spherical balls or bumps 146. In some applications, bumps 146 are reflowed a second time to improve electrical contact to conductive pillars 136a and 144. An under bump metallization (UBM) 148 can be formed under bumps 146. The bumps can also be compression bonded to conductive pillars 136a and 144. Bumps 146 represent one type of interconnect structure that can be formed over vertically offset conductive pillars 136a and 144.

The combination of vertically offset conductive pillars 136a and 144 with bumps 146 constitute a composite interconnect structure with fusible portion (bumps 146) and non-fusible portion (conductive pillars 136a and 144). While bumps 146 appear to overlap in plan view, the vertically offset between conductive layers 136a and 144 maintain physical separation between adjacent bumps. Conductive pillars 136a and 144 can be placed closer together to achieve a fine interconnect pitch without electrically shorting adjacent bumps 146.

Figure 5A:
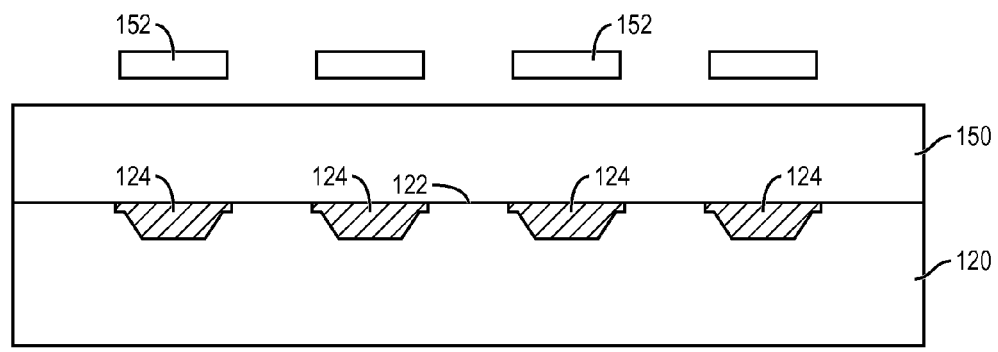
FIGS. 5a-5h illustrate another process of forming vertically offset conductive pillars over a substrate.
Figure 5B:
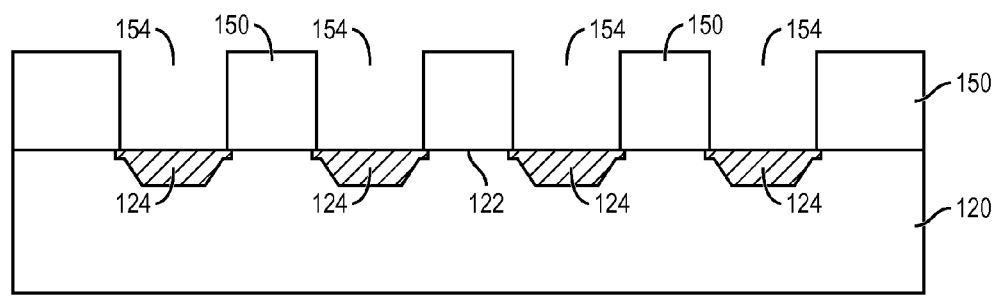

Another embodiment of forming vertically offset conductive pillars over the substrate is shown in FIGS. 5a-5h. Continuing from FIG. 4a, a first photoresist layer 150 is deposited over active surface 122 and contact pads 124. A mask 152 is positioned over contact pads 124 and photoresist layer 150 is exposed to UV light. In FIG. 5b, mask 152 is removed and the portion of photoresist layer 150 that was under the mask is removed by an etching process to form openings 154 and expose contact pads 124. The remaining portion of photoresist layer 150 still covers active surface 122 between contact pads 124.

Figure 5C:
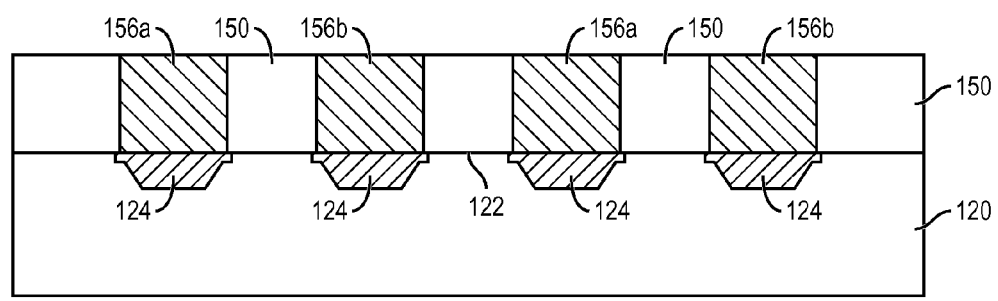

In FIG. 5c, an electrically conductive layer 156 is formed within openings 154 of photoresist 150 over contact pads 124 using a patterning and metal deposition process such as printing, PVD, CVD, sputtering, electrolytic plating, and electroless plating. Conductive layer 156 can be one or more layers of Al, Cu, Sn, Ni, Au, Ag, or other suitable electrically conductive material. Conductive layer 156 formed in openings 154 provides first level conductive pillars electrically connected to contact pads 124 and the circuits on active surface 122. The first level conductive pillars are identified as alternating conductive pillars 156a.

Figure 5D:
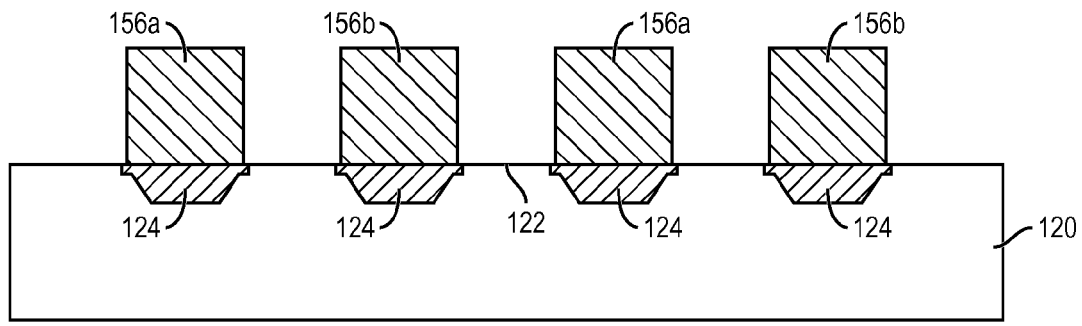
Figure 5E:
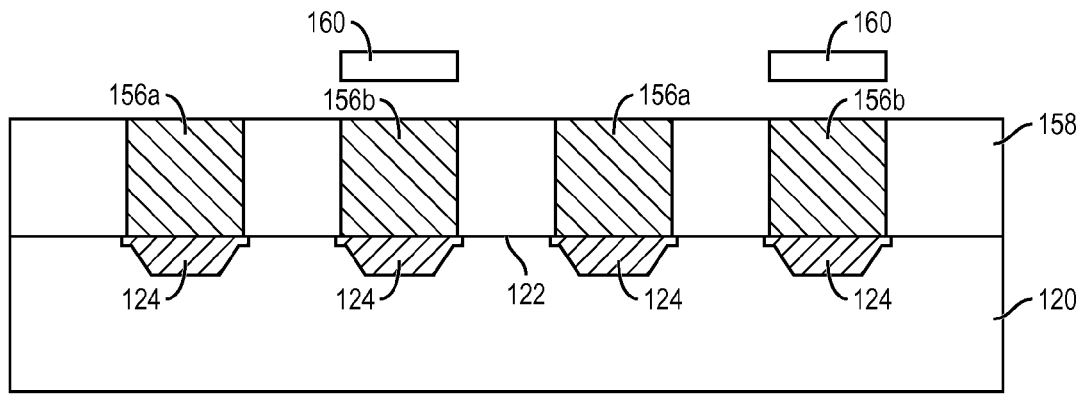
Figure 5F:
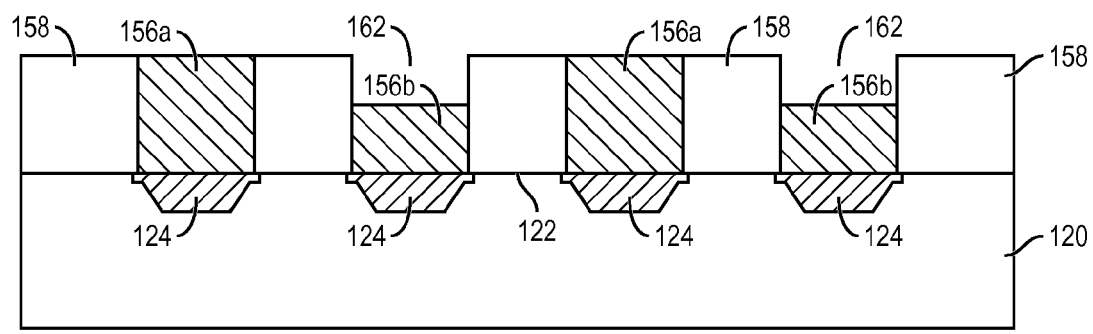

In FIG. 5d, the remaining portion of photoresist layer 150 is removed. A second photoresist layer 158 is deposited over active surface 122 around first level conductive pillars 156a and 156b, as shown in FIG. 5e. A mask 160 is positioned over alternating conductive pillars 156b and photoresist layer 158 is exposed to UV light. In FIG. 5f, mask 160 is removed and the portion of photoresist layer 158 that was under the mask is removed by an etching process to form openings 162. In addition, a portion of conductive pillars 156b is removed by the etching process to create a vertical offset between first level conductive pillars 156a and second level conductive pillars 156b. The remaining portion of photoresist layer 158 still covers active surface 122.

Figure 5G:
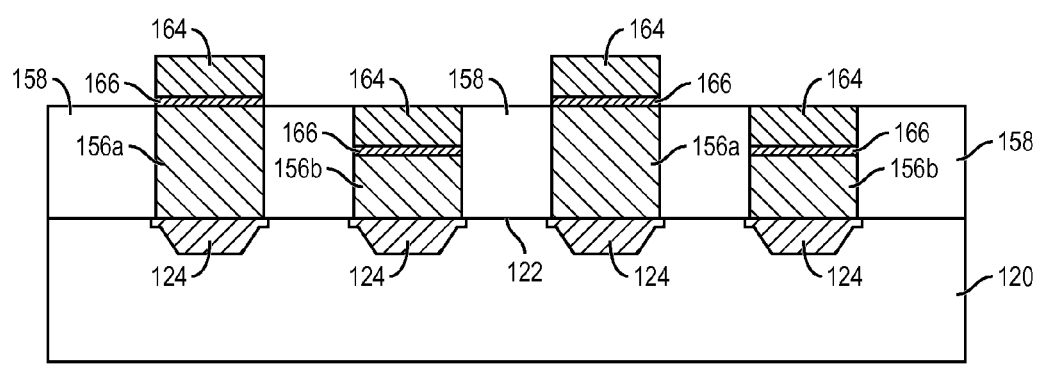

In FIG. 5g, an electrically conductive bump material 164 is deposited over first level conductive pillars 156a and into opening 162 over second level conductive pillars 156b using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. A UBM 166 can be formed under bump material 164.

Figure 5H:
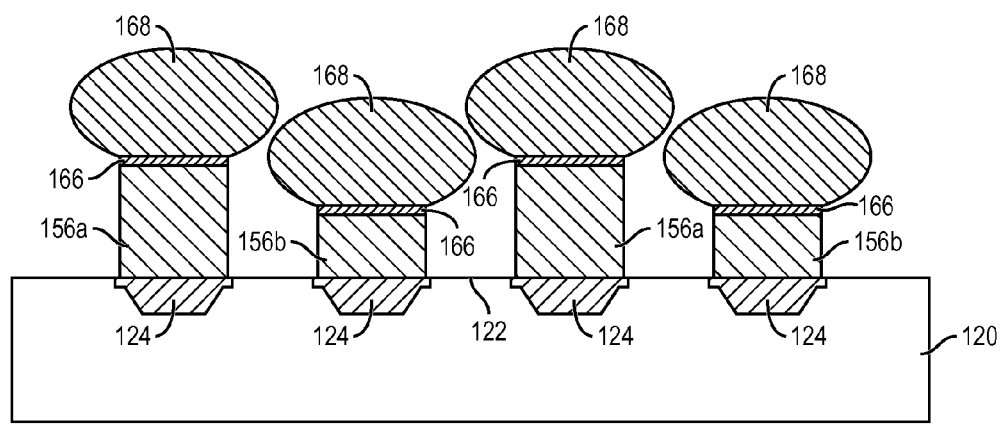

In FIG. 5h, the remaining portion of photoresist layer 158 is removed. Bump material 164 is bonded to vertically offset conductive pillars 156a and 156b using a suitable attachment or bonding process. In one embodiment, bump material 164 is reflowed by heating the material above its melting point to form spherical balls or bumps 168. In some applications, bumps 168 are reflowed a second time to improve electrical contact to conductive pillars 156a and 156b. The bumps can also be compression bonded to conductive pillars 156a and 156b. Bumps 168 represent one type of interconnect structure that can be formed over vertically offset conductive pillars 156a and 156b.

The combination of vertically offset conductive pillars 156a and 156b with bumps 168 constitute a composite interconnect structure with fusible portion (bumps 168) and non-fusible portion (conductive pillars 156a and 156b). While bumps 168 appear to overlap in plan view, the vertically offset between conductive layers 156a and 156b maintain physical separation between adjacent bumps. Conductive pillars 156a and 156b can be placed closer together to achieve a fine interconnect pitch without electrically shorting adjacent bumps 168.

Figure 6A:
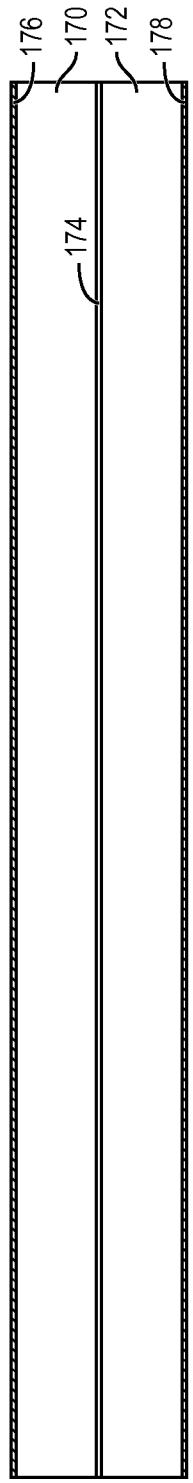
FIGS. 6a-6n illustrate a process of forming vertically offset BOT interconnect sites over a substrate.

FIGS. 6a-6m illustrate a process of forming vertically offset BOT interconnect sites over a substrate. In FIG. 6a, a temporary metal carrier 170 is bonded to a similar temporary metal carrier 172 using adhesive 174. In one embodiment, carrier 170 is copper. An electrically conductive layer 176 is formed on carrier 170. Likewise, an electrically conductive layer 178 is formed on carrier 172. Conductive layers 176 and 178 operate as seed layers and can be Cu, Ni, nickel vanadium (NiV), Au, or Al. The seed layers 176 and 178 are patterned and deposited using electrolytic plating, electroless plating, sputtering, PVD, CVD, or other suitable metal deposition process.

Figure 6B:
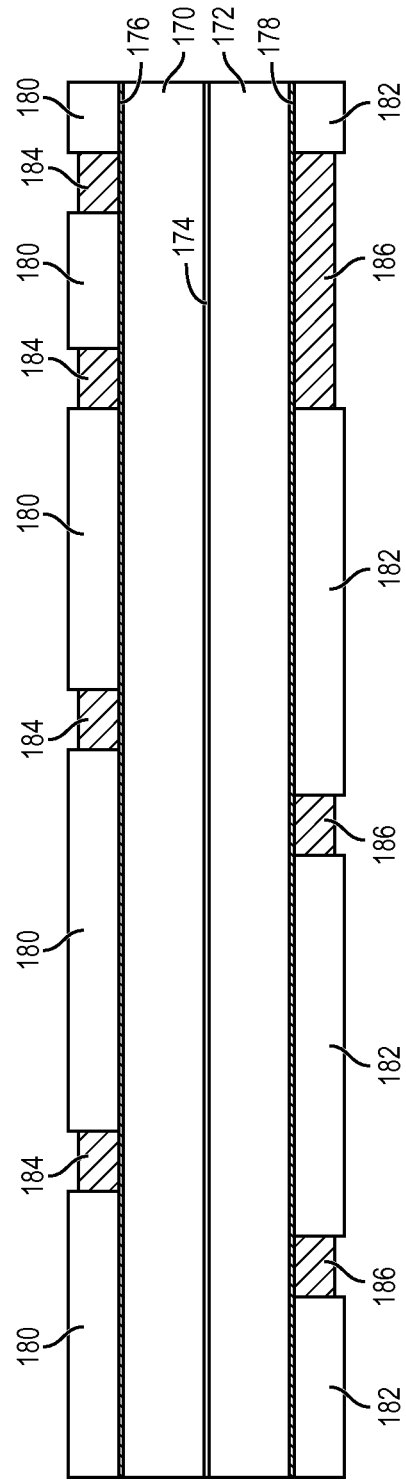
Figure 6C:
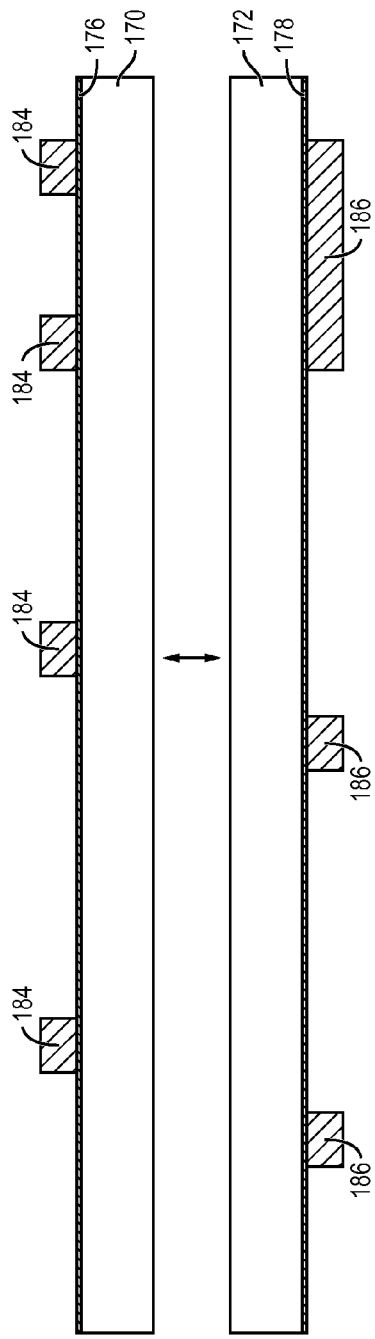

In FIG. 6b, high-resolution dry film photoresist layers 180 and 182 are formed over conductive layers 176 and 178, respectively. A portion of dry film layers 180 and 182 is removed to expose conductive layers 176 and 178.

An electrically conductive layer 184 is formed in the removed portions of dry film layer 180 over the exposed areas of conductive layer 176. Likewise, an electrically conductive layer 186 is formed in the removed portions of dry film layer 182 over the exposed areas of conductive layer 178. Conductive layers 184 and 186 can be Al, Cu, Sn, Ni, Au, Ag, or other suitable electrically conductive material. The deposition of conductive layers 184 and 186 uses electrolytic plating or electroless plating process.

The dry film layers 180 and 182 are removed, leaving conductive layers 184 and 186 extending above seed layers 176 and 178, respectively. The carriers 170 and 172 are separated in FIG. 6c.

Figure 6D:
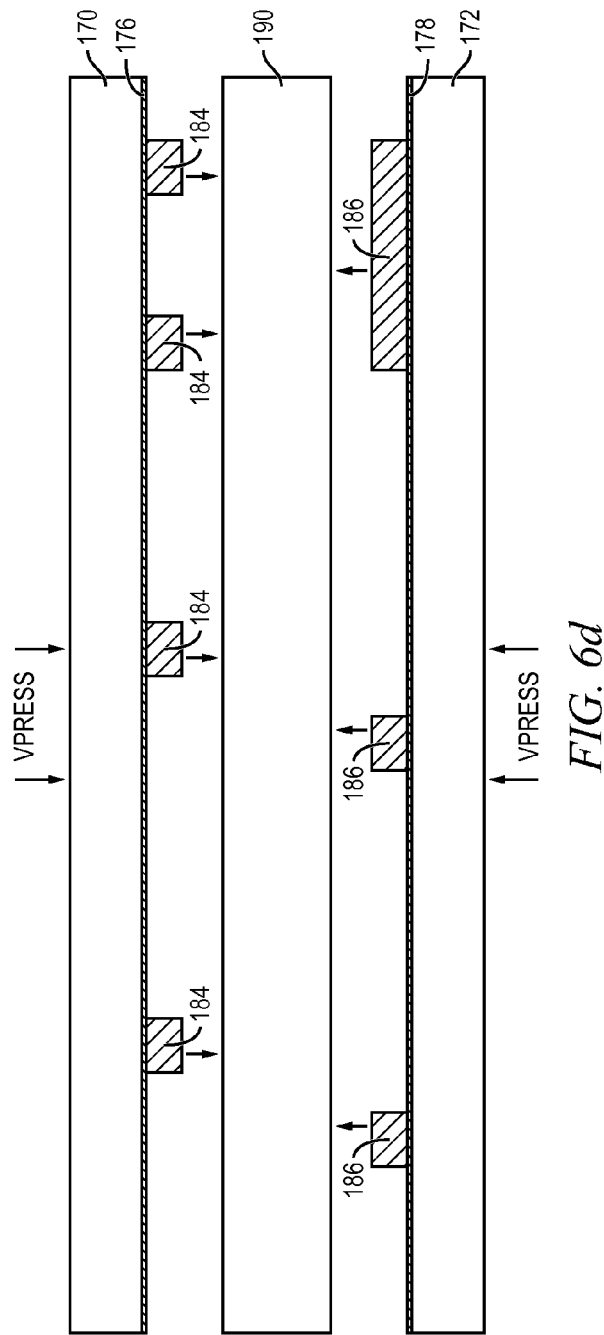
Figure 6I:
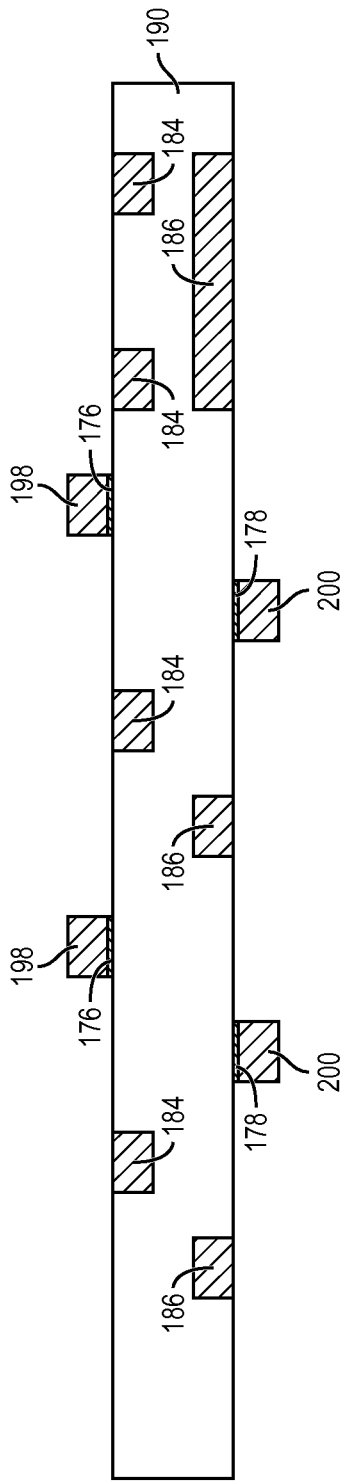

In FIG. 6d, carriers 170 and 172 are inverted and placed over substrate 190, leading with the conductive layers 184 and 186. Substrate 190 is made with silicon or other suitable base material. Conductive layers 184 and 186 are pressed into substrate 190 using a vacuum press (v-press) operation, as shown in FIG. 6e. The pressing operation forces conductive layers 184 and 186 below a surface of substrate 190. The recessed or buried conductive layers 184 and 186 contact conductive traces within substrate 190. The carriers 170 and 172 are removed in FIG. 6f.

In FIG. 6g, a high-resolution dry film photoresist layers 192 is formed over conducive layer 176. In a similar manner, a high-resolution dry film photoresist layer 194 is formed over conductive layer 178. A portion of dry film layers 192 and 194 is removed between conductive layers 184 and 186.

An electrically conductive layer 198 is formed in the removed portions of dry film layer 192 over conductive layer 176 and between conductive layer 184. Likewise, an electrically conductive layer 200 is formed in the removed portions of dry film layer 194 over conductive layer 178 and between conductive layer 186. Conductive layers 198 and 200 can be Al, Cu, Sn, Ni, Au, Ag, or other suitable electrically conductive material. The deposition of conductive layers 198 and 200 uses electrolytic plating or electroless plating process.

In FIG. 6h, dry film layers 192 and 194 are removed, leaving raised conductive layers 198 and 200 over conductive layers 176 and 178, respectively. The portions of conductive layers 176 and 178 outside conductive layers 198 and 200 are removed in FIG. 6i, leaving conductive layers 184 and 186 embedded or recessed below a surface of substrate 190, and conductive layers 198 and 200 raised above the surface of substrate 190. Alternating portions of conductive layer 198 are vertically offset with respect to alternating portions of conductive layer 184. Likewise, alternating portions of conductive layer 200 are vertically offset with respect to alternating portions of conductive layer 186. In one embodiment, conductive layers 198 and 200 are 20 micrometers (μm) above substrate 190.

Figure 6J:
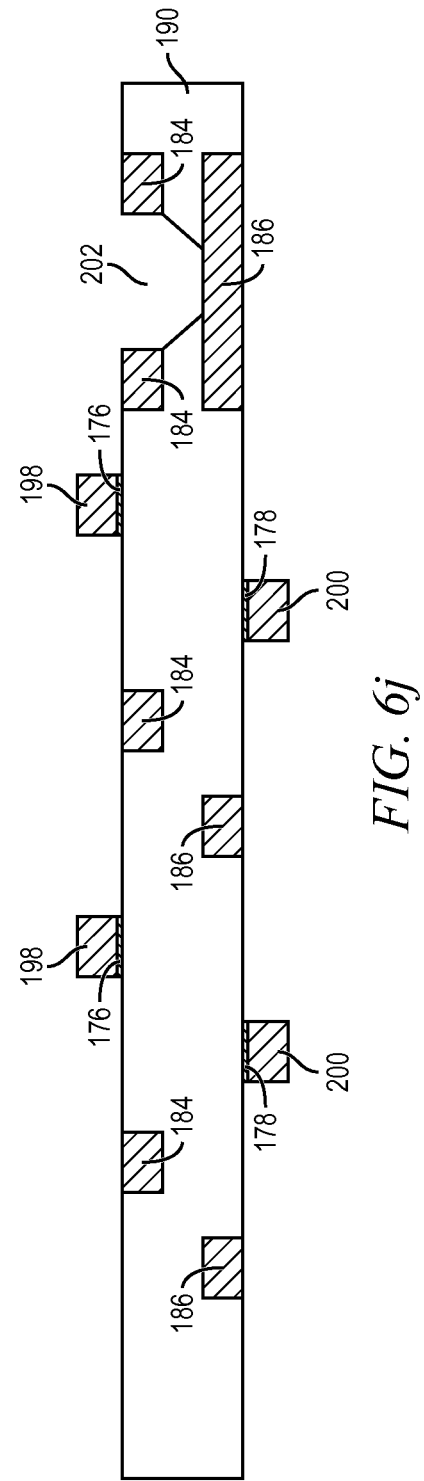
Figure 6K:
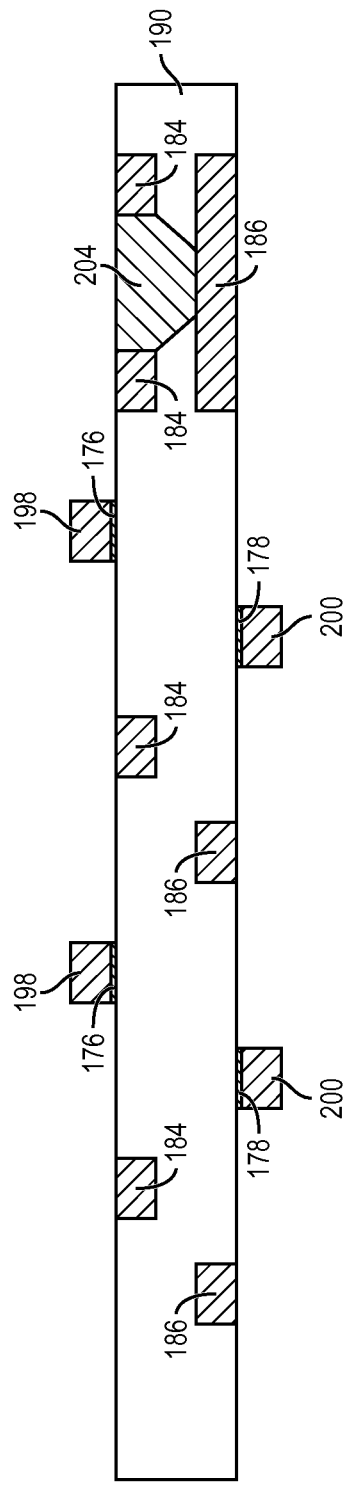

In FIG. 6j, via 202 is formed in substrate 190 using mechanical drilling, laser drilling, or etching operation. In FIG. 6k, via 202 is filled with conductive material 204 electrolytic plating or electroless plating process to electrically connect conductive layer 184 through substrate 190 to conductive layer 186. Conductive material 204 can be Al, Cu, Sn, Ni, Au, Ag, or other suitable electrically conductive material.

Figure 6L:
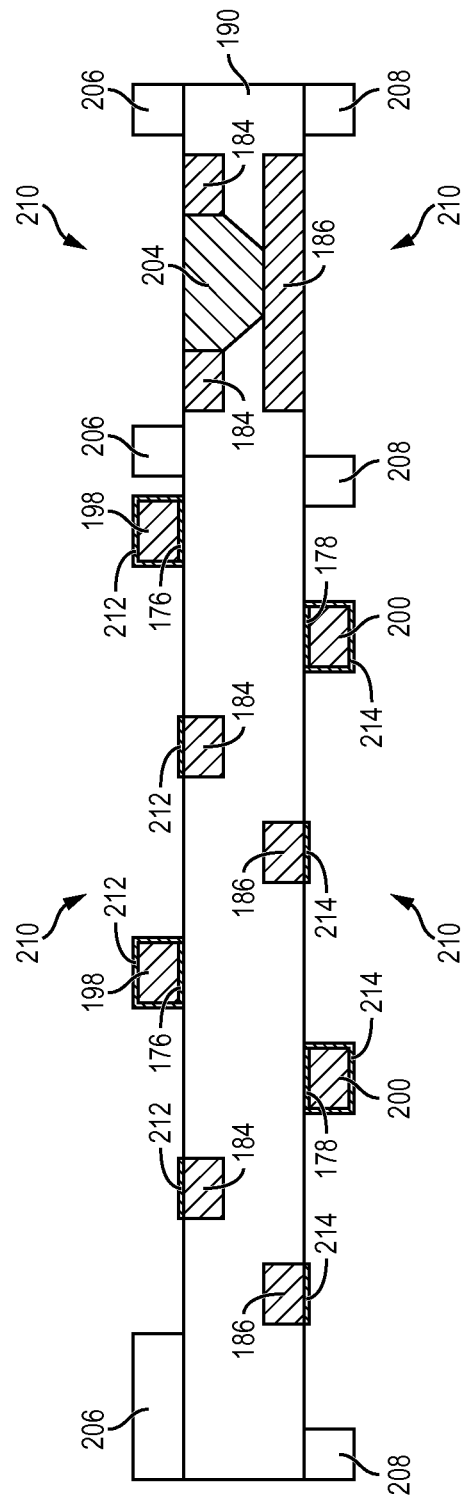

In FIG. 6l, high-resolution dry film photoresist layers 206 and 208 are formed over substrate 190. A portion of dry film layers 206 and 208 is removed to expose conductive layers 184, 186, 198, and 200 with an irregular or open solder resist opening (SRO) 210. An electrically conductive layer 212 is formed over recessed conductive layer 184 and raised conductive layer 198. Likewise, an electrically conductive layer 214 is formed over recessed conductive layer 186 and raised conductive layer 200. Conductive layers 212 and 214 can be Al, Cu, Sn, Ni, Au, Ag, or other suitable electrically conductive material. The deposition of conductive layers 212 and 214 uses PVD, CVD, electrolytic plating, or electroless plating process.

Figure 6M:
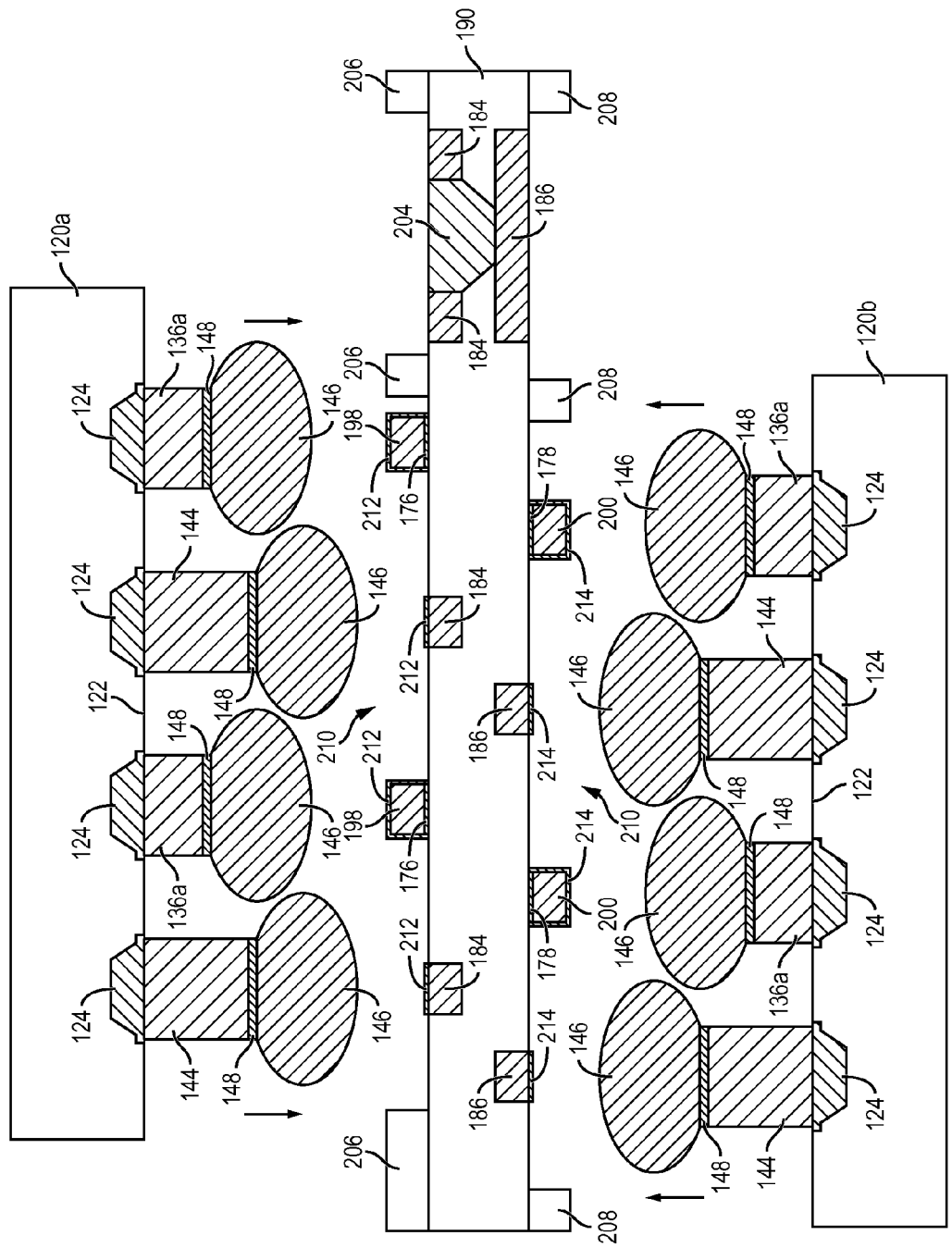

In FIG. 6m, a first substrate 120a with vertically offset conductive pillars 136a and 144 from FIG. 4l, or substrate 120a with vertically offset conductive pillars 156a and 156b from FIG. 5h, is positioned over substrate 190. A second substrate 120b with vertically offset conductive pillars 136a and 144 from FIG. 4l, or substrate 120b with vertically offset conductive pillars 156a and 156b from FIG. 5h, is positioned over the opposite surface of substrate 190. Conductive pillars 136a are aligned with raised conductive layers 198 and 200, and conductive pillars 144 are aligned with embedded conductive layers 184 and 186.

Figure 6N:
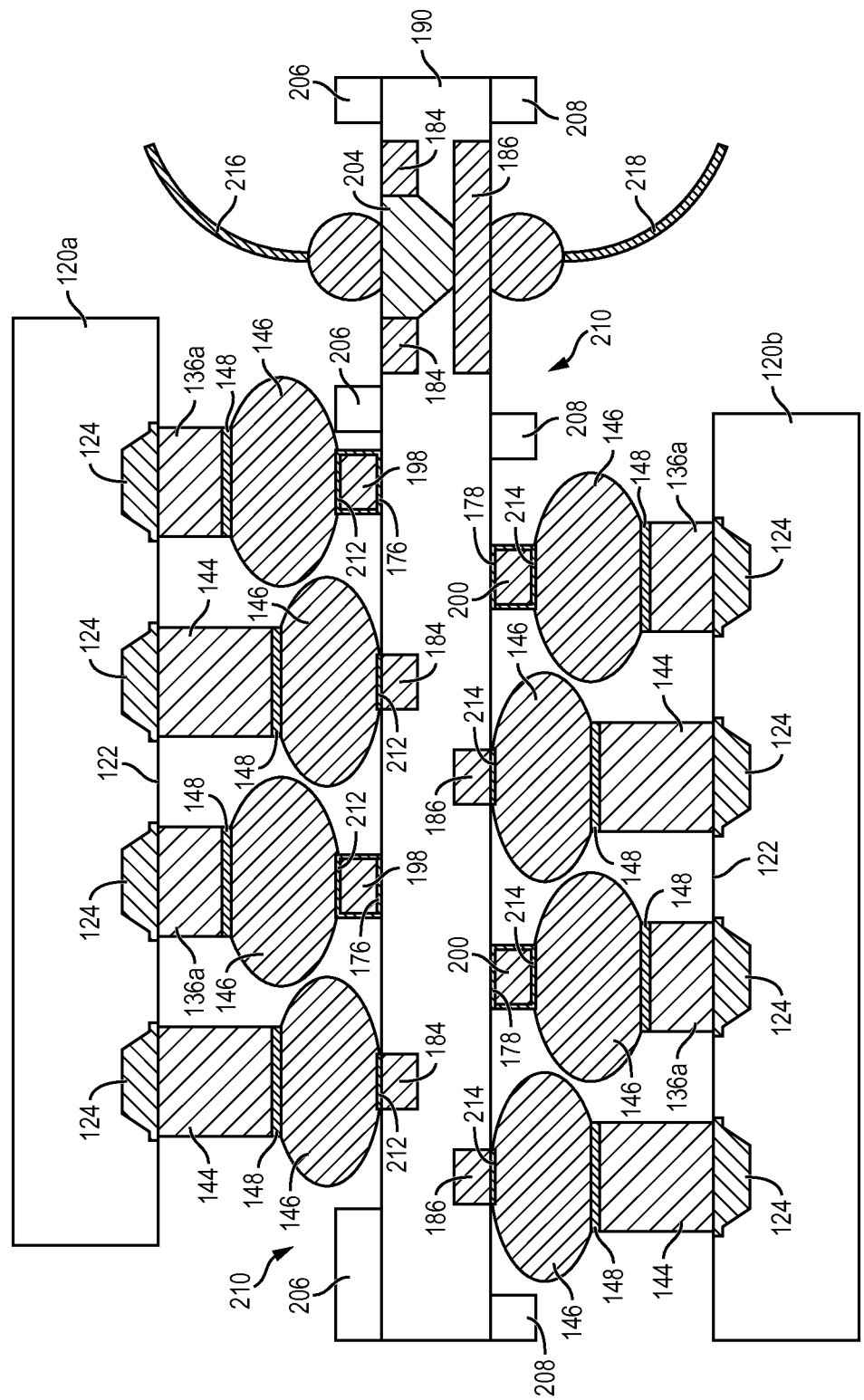

In FIG. 6n, substrates 120 are brought into proximity with substrate 190 so that conductive pillars 136a can be electrically and metallurgically bonded to raised conductive layers 198 and 200 to form a BOT interconnection, and conductive pillars 144 can be electrically and metallurgically bonded to embedded conductive layers 184 and 186 to form a BOT interconnection, all within the open SRO 210. The various embodiments may use only substrate 120a or only substrate 120b, or both substrates 120a and 120b. In addition, bond wires 216 and 218 can be bonded to opposing sides of conductive via 204 within the open SRO 210 and routed to external electronic components. The dry film photoresist layers 206 and 208 are optionally removed.

The vertically offset conductive pillars on substrate 120, together with the embedded conductive layers 184 and 186 and raised conductive layers 198 and 200, provide a fine pitch interconnect structure within the open SRO 210.

Figure 7A:
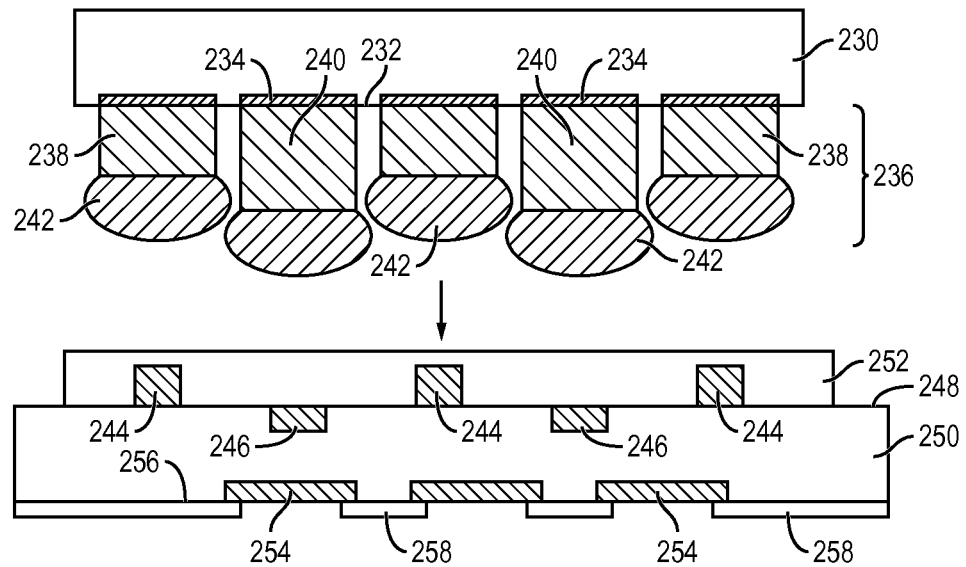
FIGS. 7a-7c illustrate a flipchip semiconductor substrate with vertically offset conductive pillars mounted to vertically offset BOT interconnect sites over a substrate.
Figure 7B:
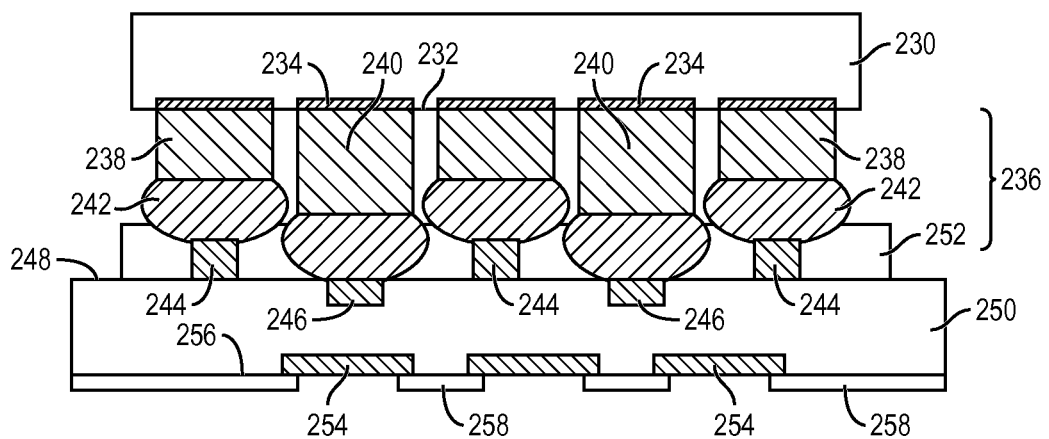
Figure 7C:
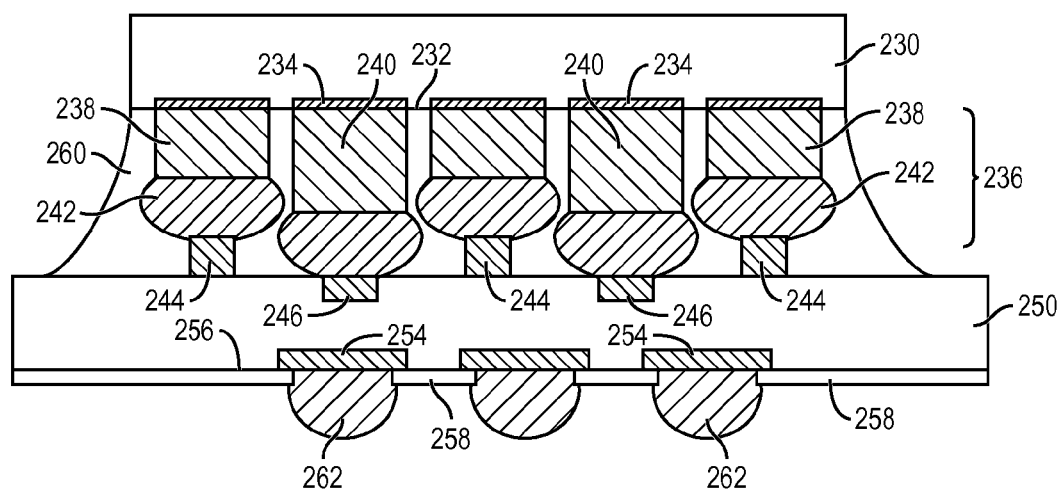

FIGS. 7a-7c show another embodiment with vertically offset conductive pillars formed over the substrate and the substrate mounted to vertically offset BOT interconnect sites in a flipchip arrangement. FIG. 7a shows a semiconductor substrate 230 containing a base semiconductor material, such as silicon, germanium, gallium arsenide, indium phosphide, or silicon carbide, for structural support. A plurality of analog or digital circuits can be formed on active surface 232 of substrate 230, implemented as active devices, passive devices, conductive layers, and dielectric layers and electrically interconnected according to the electrical design and function of the die. For example, the circuit may include one or more transistors, diodes, and other circuit elements formed within active surface 232 to implement analog circuits or digital circuits, such as DSP, ASIC, memory, or other signal processing circuit. A plurality of IPD, such as inductors, capacitors, and resistors, can also be formed over substrate 230 for RF signal processing. A plurality of electrical contact pads 234 is formed in active surface 232 and electrically connected to the circuits and IPDs on the active surface. Substrate 230 is a flipchip type semiconductor die.

A vertically offset composite interconnect structure 236 is formed over active surface 232, similar to FIGS. 4a-4l or FIGS. 5a-5h. The vertically offset composite interconnect structure 236 includes vertically offset conductive pillars 238 and 240 and bumps 242. The alternating conductive pillars 240 have greater height than the alternating conductive pillars 238. The conductive pillars 238 and 240 contain non-fusible material, while bumps 242 contain fusible material.

A plurality of vertically offset BOT interconnect sites 244 and 246 is formed over and within substrate 250, similar to FIGS. 6a-6n. The alternating BOT interconnect sites 244 are formed over surface 248 of substrate 250, while the alternating BOT interconnect sites 246 are embedded within substrate 250. A jet flux material 252 is deposited over surface 248 and BOT interconnect sites 244 and 246. Substrate 230 is positioned over substrate 250 with conductive pillars 238 aligned with raised BOT interconnect sites 244 and conductive pillars 240 aligned with embedded BOT interconnect sites 246.

A conductive layer 254 is patterned over surface 256 of substrate 250, opposite surface 248. Conductive layer 254 operates as bond pads for substrate 250. An insulating layer 258 is formed over surface 256 and bond pads 254. A portion of insulating layer 258 is removed by an etching process to expose bond pads 254.

In FIG. 7b, substrate 230 is brought into proximity with substrate 250 so that conductive pillars 238 and bumps 242 can be electrically and metallurgically bonded to raised BOT interconnect sites 244, and conductive pillars 240 and bumps 242 can be electrically and metallurgically bonded to embedded interconnect sites 246. Jet flux material 252 aids in the metallurgical connections between conductive pillars 238 and 240 and BOT interconnect sites 244 and 246.

In FIG. 7c, an underfill material 260, such as epoxy resin, is deposited between substrate 230 and substrate 250. An electrically conductive bump material is deposited over contact pads 254 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 254 using a suitable attachment or bonding process. In one embodiment, the bump material is reflowed by heating the material above its melting point to form spherical balls or bumps 262. In some applications, bumps 262 are reflowed a second time to improve electrical contact to contact pads 254. The bumps can also be compression bonded to contact pads 254.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a first substrate;
a conductive layer formed over the first substrate;
a plurality of conductive pillars formed over a first portion of the conductive layer vertically offset with respect to a second portion of the conductive layer alternating with the first portion of the conductive layer;
a first interconnect structure disposed over the second portion of the conductive layer; and
a second interconnect structure disposed over the conductive pillars with the second interconnect structure overlapping the first interconnect structure.

2. The semiconductor device of claim 1, wherein the first interconnect structure and second interconnect structure includes a bump.

3. The semiconductor device of claim 1, further including an under bump metallization layer formed over the conductive layer and conductive pillars.

4. The semiconductor device of claim 1, further including:
a second substrate; and
a plurality of interconnect sites disposed over the second substrate.

5. The semiconductor device of claim 4, wherein the interconnect sites are bond on trace interconnect sites.

6. The semiconductor device of claim 4, wherein the first substrate is disposed over the second substrate with the first interconnect structure and second interconnect structure bonded to the interconnect sites.

7. A semiconductor device, comprising:
a first substrate;
a plurality of first conductive pillars formed over the first substrate;
a plurality of second conductive pillars formed over a first portion of the first conductive pillars and vertically offset with respect to a second portion of the first conductive pillars alternating with the first portion of the first conductive pillars; and
a plurality of bumps formed over the first and second conductive pillars with the bumps formed over adjacent ones of the first and second conductive pillars overlapping.

8. The semiconductor device of claim 7, further including an under bump metallization layer formed over the first and second conductive pillars.

9. The semiconductor device of claim 7, further including:
a second substrate;
a first interconnect site disposed within a first surface of the second substrate; and
a second interconnect site disposed over the first surface of the second substrate vertically offset with respect to the first interconnect site.

10. The semiconductor device of claim 9, wherein the first interconnect site and second interconnect site are bond on trace interconnect sites.

11. The semiconductor device of claim 9, wherein the first substrate is disposed over the second substrate with the bumps bonded to the first interconnect site and second interconnect site.

12. The semiconductor device of claim 9, further including:
a third interconnect site disposed within a second surface of the second substrate opposite the first surface of the second substrate; and
a fourth interconnect site disposed over the second surface of the second substrate vertically offset with respect to the third interconnect site.

13. The semiconductor device of claim 12, further including a third substrate disposed over the second surface of the second substrate and bonded to the third interconnect site and fourth interconnect site.

14. A semiconductor device, comprising:
a first substrate;
a plurality of first conductive pillars formed over the first substrate; and
a plurality of second conductive pillars formed over a first portion of the first conductive pillars vertically offset with respect to a second portion of the first conductive pillars alternating with the first portion.

15. The semiconductor device of claim 14, further including:
a plurality of first bumps disposed over the second conductive pillars; and
a plurality of second bumps disposed over the first conductive pillars overlapping the first bumps.

16. The semiconductor device of claim 15, further including:
- a second substrate; and
- a plurality of interconnect sites disposed over a first surface of the second substrate.

17. The semiconductor device of claim 16, wherein the interconnect sites are bond on trace interconnect sites.

18. The semiconductor device of claim 16, wherein the first substrate is disposed over the second substrate with the first bumps and second bumps bonded to the interconnect sites.

19. The semiconductor device of claim 16, further including a plurality of third bumps formed over a second surface of the second substrate opposite the first surface of the second substrate.

20. A semiconductor device, comprising:
- a first substrate including a conductive layer disposed over the first substrate; and
- a conductive pillar formed over a first portion of the conductive layer vertically offset with respect to a second portion of the conductive layer alternating with the first portion.

21. The semiconductor device of claim 20, wherein the conductive pillar is non-fusible.

22. The semiconductor device of claim 21, further including:
- a first interconnect structure disposed over the second portion of the conductive layer; and
- a second interconnect structure disposed over the conductive pillar overlapping the first interconnect structure.

23. The semiconductor device of claim 22, further including:
- a second substrate; and
- a plurality of interconnect sites disposed over the second substrate to align with the first interconnect structure and second interconnect structure.

24. The semiconductor device of claim 23, wherein the first substrate is disposed over the second substrate with the first interconnect structure and second interconnect structure bonded to the interconnect sites.

25. The semiconductor device of claim 20, further including a bond wire formed over the first substrate.

* * * * *